(12) United States Patent
Hirano et al.

(10) Patent No.: US 11,049,999 B2
(45) Date of Patent: Jun. 29, 2021

(54) TEMPLATE, NITRIDE SEMICONDUCTOR ULTRAVIOLET LIGHT-EMITTING ELEMENT, AND METHOD OF MANUFACTURING TEMPLATE

(71) Applicant: Soko Kagaku Co., Ltd., Ishikawa (JP)

(72) Inventors: Akira Hirano, Aichi (JP); Yosuke Nagasawa, Ishikawa (JP)

(73) Assignee: SOKO KAGAKU CO., LTD., Ishikawa (JP)

(*) Notice: Subject to any disclaimer, the term of this patent is extended or adjusted under 35 U.S.C. 154(b) by 445 days.

(21) Appl. No.: 16/066,414

(22) PCT Filed: Sep. 29, 2017

(86) PCT No.: PCT/JP2017/035559
§ 371 (c)(1),
(2) Date: Jun. 27, 2018

(87) PCT Pub. No.: WO2018/216240
PCT Pub. Date: Nov. 29, 2018

(65) Prior Publication Data
US 2020/0373463 A1    Nov. 26, 2020

(30) Foreign Application Priority Data
May 26, 2017 (WO) .................. PCT/JP2017/019657

(51) Int. Cl.
*H01L 33/32* (2010.01)
*H01L 33/00* (2010.01)
(Continued)

(52) U.S. Cl.
CPC ........ *H01L 33/32* (2013.01); *H01L 21/02458* (2013.01); *H01L 33/007* (2013.01);
(Continued)

(58) Field of Classification Search
CPC . H01L 33/06; H01L 21/0242; H01L 33/0075; H01L 21/02458; H01L 21/02502;
(Continued)

(56) References Cited

U.S. PATENT DOCUMENTS

| 7,956,356 B2 | 6/2011 | Tanikella et al. |
| 8,455,879 B2 | 6/2013 | Tanikella et al. |

(Continued)

FOREIGN PATENT DOCUMENTS

| EP | 2731151 A1 | 5/2014 |
| EP | 2896725 A1 | 7/2015 |

(Continued)

OTHER PUBLICATIONS

EP Extended EP Search Report in related Application No. 17872879.6 dated Jul. 25, 2019, 8 pages.
(Continued)

*Primary Examiner* — Savitri Mulpuri
(74) *Attorney, Agent, or Firm* — Haynes Beffel & Wolfeld LLP

(57) ABSTRACT

A template includes a sapphire substrate with a (0001) plane or a plane inclined by a predetermined angle with respect to the (0001) plane as a main surface, and an AlN layer composed of AlN crystals having an epitaxial crystal orientation relationship with the main surface directly formed on the main surface of the sapphire substrate. In the template, an average particle diameter of the AlN crystals of the AlN layer at a thickness of 20 nm from the main surface is 100 nm or less.

6 Claims, 17 Drawing Sheets

(51) Int. Cl.
*H01L 33/18* (2010.01)
*H01L 21/02* (2006.01)
*H01L 33/06* (2010.01)
*H01L 33/12* (2010.01)

(52) U.S. Cl.
CPC .............. *H01L 33/06* (2013.01); *H01L 33/12* (2013.01); *H01L 33/18* (2013.01)

(58) Field of Classification Search
CPC ............. H01L 21/0254; H01L 21/0262; H01L 21/02661; H01L 33/32; H01L 33/12; H01L 33/007; H01L 33/18; H01L 21/20; C30B 25/186; C30B 29/403
See application file for complete search history.

(56) References Cited

U.S. PATENT DOCUMENTS

| | | | |
|---|---|---|---|
| 9,356,192 | B2 | 5/2016 | Pernot et al. |
| 2009/0057646 | A1 | 3/2009 | Hirayama et al. |
| 2012/0258286 | A1 | 10/2012 | Amano et al. |
| 2012/0291698 | A1 | 11/2012 | Melnik et al. |
| 2014/0158983 | A1 | 6/2014 | Pernot et al. |
| 2014/0209857 | A1 | 7/2014 | Takano et al. |
| 2017/0250308 | A1 | 8/2017 | Jo et al. |
| 2018/0010246 | A1 | 1/2018 | Nemoto et al. |
| 2018/0363164 | A1* | 12/2018 | Schowalter ............. C30B 25/10 |

FOREIGN PATENT DOCUMENTS

| | | |
|---|---|---|
| JP | 2006253462 A | 9/2006 |
| JP | 2006287120 A | 10/2006 |
| JP | 2009054780 A | 3/2009 |
| JP | 201064911 A | 3/2010 |
| JP | 2011023677 A | 2/2011 |
| JP | 2011254068 A | 12/2011 |
| JP | 2013211442 A | 10/2013 |
| JP | 201664928 A | 4/2016 |
| JP | 2017154964 A | 9/2017 |
| RU | 2412037 C1 | 2/2011 |
| RU | 2414550 C1 | 3/2011 |
| RU | 2009137422 A | 4/2011 |
| RU | 2561761 C1 | 9/2015 |
| TW | 201308656 A | 2/2013 |
| TW | 201703118 A | 1/2017 |
| WO | 2011077541 A1 | 6/2011 |
| WO | 2013005789 A1 | 1/2013 |
| WO | 2013021464 A1 | 2/2013 |

OTHER PUBLICATIONS

Kaeding et al. "Growth and laser-assisted liftoff of low dislocation density AlN films for deep-UV light-emitting diodes," Journal of Crystal Growth 272, Dec. 10, 2004 pp. 257-263.

Tikhonov et al. "TEM study of defects in AlxGa1-xN layers with different polarity," Journal of Crystal Growth, vol. 338, Jan. 1, 2012, pp. 30-34.

Bai J et. al.: "Optical properties of AlGaN/GaN multiple quantum well structure by using a high-temperature AlN buffer on sapphire substrate", Journal of Applied Physics, American Institute of Physics, US, vol. 99, No. 2, Jan. 20, 2006 (Jan. 20, 2006), pp. 23513-023513.

Okada et. al.: "Growth of high-quality and crack free AlN layers on sapphire substrate by multi-growth mode modification", Journal of Crystal Growth, Elsevier, Amsterdam, NL, vol. 298, Feb. 13, 2007 (Feb. 13, 2007) pp. 349-353.

Hirayama et al. "222-282 nm AlGaN and InAlGaN-based deep-UV LEDs fabricated on high-quality AlN on sapphire," PSS vol. 206(6), Mar. 22, 2009, pp. 1176-1182.

* cited by examiner

Off Angle: 0.2°   Thickness: 20nm

Measurement Region 1

| | | | | |
|---|---|---|---|---|
| ①76.5<br>②62.9<br>③88.8<br>④3 | ①61.1<br>②51.8<br>③70.3<br>④2 | ①77.7<br>②74.0<br>③81.4<br>④2 | ①65.4<br>②62.9<br>③70.3<br>④3 | ①61.1<br>②51.8<br>③70.3<br>④2 |
| ①59.2<br>②51.8<br>③66.6<br>④2 | ①52.7<br>②33.3<br>③70.3<br>④4 | ①53.0<br>②33.3<br>③74.0<br>④3 | ①64.1<br>②40.7<br>③77.7<br>④3 | ①61.1<br>②44.4<br>③77.7<br>④4 |
| ①68.5<br>②55.5<br>③81.4<br>④2 | ①69.4<br>②66.6<br>③74.0<br>④4 | ①70.3<br>②70.3<br>③70.3<br>④1 | ①51.8<br>②44.4<br>③59.2<br>④3 | ①61.7<br>②55.5<br>③66.6<br>④4 |
| ①70.3<br>②70.3<br>③70.3<br>④2 | ①62.9<br>②40.7<br>③77.7<br>④4 | ①64.1<br>②25.9<br>③88.8<br>④3 | ①83.3<br>②62.9<br>③103.6<br>④3 | ①46.3<br>②37.0<br>③55.5<br>④3 |
| ①60.4<br>②51.8<br>③66.6<br>④3 | ①83.3<br>②77.7<br>③88.8<br>④2 | ①70.3<br>②66.6<br>③74.0<br>④2 | ①66.6<br>②62.9<br>③70.3<br>④3 | ①66.6<br>②66.6<br>③66.6<br>④1 |

①Average Value (nm)
②Minimum Value (nm)
③Maximum Value (nm)
④Number of Crystal Particles Average Value of ①: 65.1nm
Average Value of ②: 54.5nm
Average Value of ③: 74.4nm
Average Value of ④: 2.7
Standard Deviation of ①: 8.98nm Range of Particle Diameter:
25.9nm or more and 103.6nm or less

Measurement Region 2

| | | | | |
|---|---|---|---|---|
| ①66.6<br>②59.2<br>③74.0<br>④2 | ①65.4<br>②55.5<br>③77.7<br>④3 | ①58.0<br>②44.4<br>③70.3<br>④3 | ①60.1<br>②51.8<br>③66.6<br>④4 | ①70.3<br>②62.9<br>③77.7<br>④2 |
| ①48.1<br>②40.7<br>③55.5<br>④2 | ①53.7<br>②48.1<br>③59.2<br>④2 | ①60.4<br>②48.1<br>③74.0<br>④3 | ①58.0<br>②40.7<br>③70.3<br>④3 | ①77.7<br>②77.7<br>③77.7<br>④2 |
| ①51.8<br>②51.8<br>③51.8<br>④1 | ①46.9<br>②44.4<br>③48.1<br>④3 | ①70.3<br>②59.2<br>③77.7<br>④4 | ①74.0<br>②74.0<br>③74.0<br>④1 | ①64.1<br>②62.9<br>③66.6<br>④3 |
| ①61.7<br>②51.8<br>③70.3<br>④3 | ①65.4<br>②48.1<br>③77.7<br>④3 | ①55.5<br>②48.1<br>③66.6<br>④4 | ①64.8<br>②55.5<br>③77.7<br>④4 | ①60.4<br>②55.5<br>③62.9<br>④3 |
| ①51.8<br>②37.0<br>③70.3<br>④3 | ①68.5<br>②55.5<br>③81.4<br>④2 | ①55.5<br>②37.0<br>③74.0<br>④2 | ①59.2<br>②55.5<br>③66.6<br>④3 | ①55.5<br>②25.9<br>③77.7<br>④3 |

①Average Value (nm)
②Minimum Value (nm)
③Maximum Value (nm)
④Number of Crystal Particles Average Value of ①: 60.9nm
Average Value of ②: 51.7nm
Average Value of ③: 69.9nm
Average Value of ④: 2.7
Standard Deviation of ①: 7.68nm Range of Particle Diameter:
25.9nm or more and 81.4nm or less

Measurement Region 3

| | | | | |
|---|---|---|---|---|
| ①62.9<br>②62.9<br>③62.9<br>④2 | ①60.4<br>②40.7<br>③77.7<br>④3 | ①53.0<br>②25.9<br>③85.1<br>④3 | ①59.2<br>②40.7<br>③70.3<br>④3 | ①59.2<br>②59.2<br>③59.2<br>④1 |
| ①47.2<br>②33.3<br>③62.9<br>④4 | ①56.7<br>②44.4<br>③77.7<br>④3 | ①79.6<br>②70.3<br>③88.8<br>④2 | ①72.8<br>②40.7<br>③92.5<br>④3 | ①56.7<br>②48.1<br>③74.0<br>④3 |
| ①53.7<br>②37.0<br>③70.3<br>④2 | ①62.9<br>②44.4<br>③74.0<br>④3 | ①66.6<br>②55.5<br>③77.7<br>④2 | ①88.8<br>②88.8<br>③88.8<br>④1 | ①51.8<br>②48.1<br>③55.5<br>④2 |
| ①58.0<br>②40.7<br>③81.4<br>④3 | ①53.0<br>②33.3<br>③88.8<br>④3 | ①55.5<br>②37.0<br>③66.6<br>④3 | ①83.9<br>②81.4<br>③85.1<br>④3 | ①51.8<br>②48.1<br>③55.5<br>④2 |
| ①59.2<br>②59.2<br>③59.2<br>④1 | ①64.1<br>②33.3<br>③96.2<br>④3 | ①50.9<br>②44.4<br>③55.5<br>④4 | ①88.8<br>②88.8<br>③88.8<br>④1 | ①85.1<br>②85.1<br>③85.1<br>④1 |

①Average Value (nm)
②Minimum Value (nm)
③Maximum Value (nm)
④Number of Crystal Particles Average Value of ①: 63.3nm
Average Value of ②: 51.7nm
Average Value of ③: 75.2nm
Average Value of ④: 2.4
Standard Deviation of ①: 12.3nm Range of Particle Diameter:
25.9nm or more and 96.2nm or less

Fig. 6

Off Angle: 0.5°  Thickness: 20nm

Measurement Region 1

| | | | | |
|---|---|---|---|---|
| ①50.6 ②37.0 ③66.6 ④3 | ①38.2 ②29.6 ③59.2 ④6 | ①59.2 ②55.5 ③66.6 ④3 | ①62.9 ②62.9 ③62.9 ④1 | ①45.3 ②40.7 ③51.8 ④4 |
| ①50.6 ②29.6 ③74.0 ④4 | ①38.2 ②25.9 ③48.1 ④3 | ①53.7 ②51.8 ③55.5 ④2 | ①56.7 ②51.8 ③62.9 ④3 | ①40.7 ②33.3 ③48.1 ④4 |
| ①46.9 ②40.7 ③51.8 ④3 | ①46.9 ②37.0 ③62.9 ④4 | ①55.5 ②40.7 ③70.3 ④3 | ①50.6 ②44.4 ③62.9 ④3 | ①50.6 ②44.4 ③55.5 ④4 |
| ①39.5 ②29.6 ③48.1 ④3 | ①46.9 ②40.7 ③51.8 ④4 | ①75.9 ②66.6 ③85.1 ④2 | ①51.1 ②29.6 ③70.3 ④5 | ①51.8 ②48.1 ③55.5 ④2 |
| ①55.5 ②48.1 ③62.9 ④3 | ①45.6 ②33.3 ③59.2 ④3 | ①59.2 ②59.2 ③59.2 ④1 | ①62.9 ②59.2 ③66.6 ④2 | ①53.7 ②51.8 ③55.5 ④2 |

①Average Value (nm)
②Minimum Value (nm)
③Maximum Value (nm)
④Number of Crystal Particles Average Value of ①: 51.5nm
Average Value of ②: 43.7nm
Average Value of ③: 60.5nm
Average Value of ④: 3.1
Standard Deviation of ①: 8.47nm Range of Particle Diameter:
25.9nm or more and 85.1nm or less

Measurement Region 2

| | | | | |
|---|---|---|---|---|
| ①41.9 ②33.3 ③55.5 ④3 | ①49.0 ②37.0 ③59.2 ④4 | ①50.0 ②44.4 ③55.5 ④5 | ①66.6 ②66.6 ③66.6 ④1 | ①48.1 ②40.7 ③55.5 ④3 |
| ①49.3 ②44.4 ③59.2 ④4 | ①43.2 ②25.9 ③55.5 ④3 | ①66.6 ②66.6 ③66.6 ④1 | ①47.4 ②40.7 ③55.5 ④5 | ①48.1 ②40.7 ③55.5 ④2 |
| ①55.5 ②33.3 ③77.7 ④2 | ①52.7 ②29.6 ③62.9 ④4 | ①66.6 ②62.9 ③70.3 ④2 | ①49.3 ②37.0 ③70.3 ④4 | ①45.6 ②33.3 ③55.5 ④3 |
| ①54.3 ②37.0 ③70.3 ④3 | ①64.1 ②62.9 ③66.6 ④3 | ①36.1 ②25.9 ③59.2 ④4 | ①40.7 ②25.9 ③66.6 ④5 | ①39.8 ②18.5 ③33.3 ④4 |
| ①42.6 ②33.3 ③51.8 ④2 | ①59.2 ②37.0 ③70.3 ④3 | ①57.4 ②55.5 ③59.2 ④2 | ①44.4 ②33.3 ③55.5 ④2 | ①64.8 ②59.2 ③70.3 ④2 |

①Average Value (nm)
②Minimum Value (nm)
③Maximum Value (nm)
④Number of Crystal Particles Average Value of ①: 51.3nm
Average Value of ②: 41.0nm
Average Value of ③: 61.0nm
Average Value of ④: 3.04
Standard Deviation of ①: 8.97nm Range of Particle Diameter:
18.5nm or more and 77.7nm or less

Measurement Region 3

| | | | | |
|---|---|---|---|---|
| ①46.9 ②44.4 ③48.1 ④3 | ①48.1 ②40.7 ③62.9 ④3 | ①50.0 ②40.7 ③55.5 ④4 | ①53.7 ②44.4 ③62.9 ④2 | ①54.3 ②44.4 ③66.6 ④3 |
| ①55.5 ②55.5 ③55.5 ④1 | ①48.1 ②33.3 ③62.9 ④5 | ①45.3 ②33.3 ③55.5 ④4 | ①48.1 ②48.1 ③48.1 ④3 | ①54.3 ②44.4 ③62.9 ④3 |
| ①55.5 ②33.3 ③70.3 ④3 | ①48.1 ②40.7 ③55.5 ④2 | ①57.4 ②48.1 ③62.9 ④4 | ①55.5 ②40.7 ③70.3 ④3 | ①30.8 ②25.9 ③40.7 ④3 |
| ①48.1 ②22.2 ③62.9 ④3 | ①39.5 ②25.9 ③51.8 ④3 | ①61.7 ②55.5 ③66.6 ④4 | ①36.1 ②25.9 ③55.5 ④3 | ①58.0 ②51.8 ③62.9 ④3 |
| ①70.3 ②70.3 ③70.3 ④1 | ①46.3 ②44.4 ③48.1 ④2 | ①45.6 ②40.7 ③55.5 ④3 | ①44.4 ②33.3 ③55.5 ④2 | ①64.8 ②59.2 ③70.3 ④2 |

①Average Value (nm)
②Minimum Value (nm)
③Maximum Value (nm)
④Number of Crystal Particles Average Value of ①: 50.6nm
Average Value of ②: 41.9nm
Average Value of ③: 59.2nm
Average Value of ④: 2.8
Standard Deviation of ①: 8.49nm Range of Particle Diameter:
22.2nm or more and 70.3nm or less

Fig. 7

Off Angle: 1.0°   Thickness: 20nm

Measurement Region 1

| | | | | |
|---|---|---|---|---|
| ①58.0 ②48.1 ③70.3 ④3 | ①74.0 ②74.0 ③74.0 ④1 | ①55.5 ②48.1 ③70.3 ④4 | ①31.5 ②25.9 ③37.0 ④2 | ①40.7 ②29.6 ③70.3 ④4 |
| ①40.7 ②29.6 ③55.5 ④5 | ①43.7 ②37.0 ③51.8 ④5 | ①43.5 ②40.7 ③48.1 ④4 | ①48.1 ②37.0 ③74.0 ④4 | ①39.5 ②29.6 ③55.5 ④3 |
| ①41.6 ②33.3 ③55.5 ④4 | ①46.6 ②37.0 ③55.5 ④5 | ①38.9 ②25.9 ③48.1 ④6 | ①35.2 ②29.6 ③44.4 ④6 | ①44.4 ②25.9 ③59.2 ④3 |
| ①44.4 ②33.3 ③62.9 ④4 | ①41.9 ②29.6 ③55.5 ④3 | ①38.9 ②33.3 ③48.1 ④6 | ①38.6 ②25.9 ③48.1 ④7 | ①46.6 ②40.7 ③51.8 ④5 |
| ①33.3 ②25.9 ③40.7 ④3 | ①39.2 ②22.2 ③48.1 ④5 | ①45.9 ②25.9 ③70.3 ④5 | ①45.3 ②33.3 ③59.2 ④4 | ①46.3 ②44.4 ③48.1 ④2 |

① Average Value (nm)
② Minimum Value (nm)
③ Maximum Value (nm)
④ Number of Crystal Particles Average Value of ①: 44.1nm
Average Value of ②: 34.6nm
Average Value of ③: 56.1nm
Average Value of ④: 4.1
Standard Deviation of ①: 8.43nm Range of Particle Diameter:
22.2nm or more and 74.0nm or less

Measurement Region 2

| | | | | |
|---|---|---|---|---|
| ①30.5 ②25.9 ③33.3 ④4 | ①31.5 ②22.2 ③40.7 ④6 | ①43.7 ②25.9 ③59.2 ④5 | ①40.7 ②33.3 ③55.5 ④6 | ①32.6 ②18.5 ③48.1 ④5 |
| ①40.7 ②33.3 ③55.5 ④5 | ①41.3 ②29.6 ③55.5 ④6 | ①42.6 ②33.3 ③62.9 ④4 | ①32.8 ②22.2 ③40.7 ④7 | ①34.9 ②25.9 ③44.4 ④7 |
| ①43.5 ②29.6 ③51.8 ④4 | ①34.5 ②25.9 ③48.1 ④6 | ①54.3 ②48.1 ③59.2 ④3 | ①41.6 ②25.9 ③62.9 ④4 | ①41.3 ②25.9 ③62.9 ④6 |
| ①41.3 ②22.2 ③55.5 ④6 | ①32.4 ②25.9 ③40.7 ④8 | ①36.1 ②25.9 ③55.5 ④8 | ①41.4 ②25.9 ③62.9 ④5 | ①28.9 ②22.2 ③40.7 ④5 |
| ①37.9 ②33.3 ③48.1 ④4 | ①43.8 ②37.0 ③62.9 ④6 | ①48.1 ②40.7 ③55.5 ④2 | ①44.4 ②25.9 ③55.5 ④5 | ①23.4 ②18.5 ③25.9 ④3 |

① Average Value (nm)
② Minimum Value (nm)
③ Maximum Value (nm)
④ Number of Crystal Particles Average Value of ①: 38.6nm
Average Value of ②: 28.1nm
Average Value of ③: 51.4nm
Average Value of ④: 5.2
Standard Deviation of ①: 6.62nm Range of Particle Diameter:
18.5nm or more and 62.9nm or less

Measurement Region 3

| | | | | |
|---|---|---|---|---|
| ①37.0 ②25.9 ③40.7 ④5 | ①38.9 ②25.9 ③55.5 ④6 | ①40.0 ②29.6 ③59.2 ④5 | ①44.4 ②33.3 ③51.8 ④5 | ①31.8 ②22.2 ③40.7 ④5 |
| ①41.4 ②25.9 ③55.5 ④5 | ①40.7 ②29.6 ③59.2 ④4 | ①36.5 ②18.5 ③59.2 ④7 | ①41.3 ②22.2 ③62.9 ④6 | ①38.5 ②25.9 ③48.1 ④5 |
| ①35.5 ②25.9 ③44.4 ④5 | ①45.0 ②25.9 ③62.9 ④6 | ①48.1 ②25.9 ③59.2 ④3 | ①38.5 ②25.9 ③55.5 ④5 | ①39.5 ②25.9 ③66.6 ④3 |
| ①49.3 ②40.7 ③55.5 ④3 | ①34.8 ②22.2 ③70.3 ④5 | ①38.6 ②22.2 ③55.5 ④7 | ①39.5 ②22.2 ③62.9 ④6 | ①53.0 ②44.4 ③62.9 ④3 |
| ①54.3 ②44.4 ③62.9 ④3 | ①51.8 ②40.7 ③74.0 ④3 | ①35.2 ②25.9 ③44.4 ④2 | ①49.3 ②33.3 ③66.6 ④3 | ①39.5 ②25.9 ③62.9 ④3 |

① Average Value (nm)
② Minimum Value (nm)
③ Maximum Value (nm)
④ Number of Crystal Particles Average Value of ①: 41.7nm
Average Value of ②: 28.4nm
Average Value of ③: 57.6nm
Average Value of ④: 4.5
Standard Deviation of ①: 5.99nm Range of Particle Diameter:
18.5nm or more and 74.0nm or less

Fig. 8

Off Angle: 0.2°    Thickness: 20nm

| | Individual Measurement Value | | Device Measurement Value | | |
|---|---|---|---|---|---|
| | Particle Diameter | | Particle Diameter | | RMS (nm) |
| | Average Particle Diameter (nm) | Standard Deviation (nm) | Average Particle Diameter (nm) | Standard Deviation (nm) | |
| Measurement Region 1 | 65.1 | 8.98 | 58.0 | 37.0 | 3.29 |
| Measurement Region 2 | 60.9 | 7.68 | 51.7 | 42.1 | 2.83 |
| Measurement Region 3 | 63.3 | 12.3 | 56.3 | 33.3 | 3.11 |
| Average Value | 63.1 | 9.65 | 55.3 | 37.5 | 3.08 |

Off Angle: 0.5°    Thickness: 20nm

| | Individual Measurement Value | | Device Measurement Value | | |
|---|---|---|---|---|---|
| | Particle Diameter | | Particle Diameter | | RMS (nm) |
| | Average Particle Diameter (nm) | Standard Deviation (nm) | Average Particle Diameter (nm) | Standard Deviation (nm) | |
| Measurement Region 1 | 51.5 | 8.47 | 30.5 | 27.5 | 3.06 |
| Measurement Region 2 | 43.7 | 8.97 | 47.7 | 65.7 | 2.93 |
| Measurement Region 3 | 60.5 | 8.49 | 43.0 | 54.9 | 2.95 |
| Average Value | 51.1 | 8.64 | 40.4 | 49.4 | 2.98 |

Off Angle: 1.0°    Thickness: 20nm

| | Individual Measurement Value | | Device Measurement Value | | |
|---|---|---|---|---|---|
| | Particle Diameter | | Particle Diameter | | RMS (nm) |
| | Average Particle Diameter (nm) | Standard Deviation (nm) | Average Particle Diameter (nm) | Standard Deviation (nm) | |
| Measurement Region 1 | 44.1 | 8.43 | 35.4 | 44.4 | 2.64 |
| Measurement Region 2 | 38.6 | 6.62 | 40.2 | 52.7 | 2.46 |
| Measurement Region 3 | 41.7 | 5.99 | 34.9 | 47.2 | 2.62 |
| Average Value | 41.5 | 7.01 | 36.8 | 48.1 | 2.57 |

Fig. 9

Off Angle: 0.2°   Thickness: 300nm

| | Device Measurement Value | |
|---|---|---|
| | Average Particle Diameter (nm) | RMS (nm) |
| Measurement Region 1 | 215 | 4.75 |
| Measurement Region 2 | 202 | 5.08 |
| Average Value | 208 | 4.91 |

Off Angle: 1.0°   Thickness: 300nm

| | Device Measurement Value | |
|---|---|---|
| | Average Particle Diameter (nm) | RMS (nm) |
| Measurement Region 1 | 184 | 4.50 |
| Measurement Region 2 | 174 | 4.56 |
| Measurement Region 3 | 206 | 4.97 |
| Average Value | 188 | 4.68 |

Patent Document 1 and Non-Patent Document 1
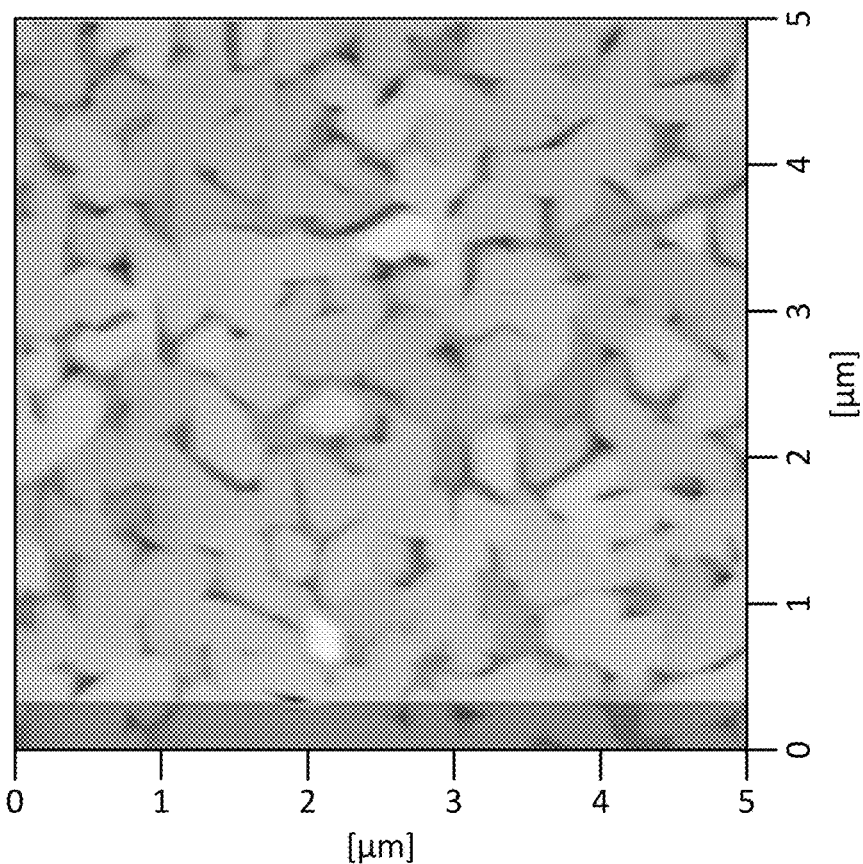
Fig. 12A
Present Invention (Off Angle: 0.2°)
Thickness: 20nm
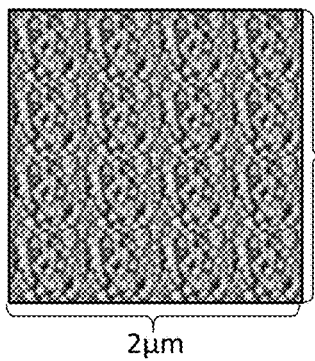
Average Particle Diameter (nm)
: 55.3nm
RMS Value : 3.08nm
Thickness: 300nm
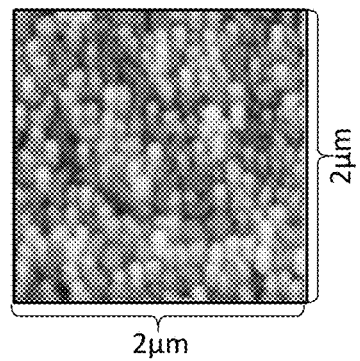
Average Particle Diameter (nm)
: 208nm
RMS Value : 4.91nm
Patent Document 1 and Non-Patent Document 1
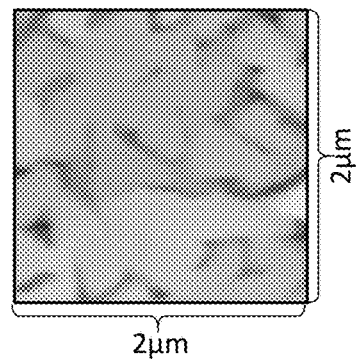
Average Particle Diameter (nm)
: about 1000nm
RMS Value : 21.4nm
Fig. 12B Average Value of FWHM by XRC: (0002) plane, ω scan

| Off Angle | Thickness: 20nm |
|---|---|
| 0.2° | 991 arcsec |
| 0.5° | 1021 arcsec |
| 1.0° | 895 arcsec |

Fig. 13A

Average Value of FWHM by XRC: (0002) plane, 2θ-ω scan

| Off Angle | Thickness: 20nm | Thickness: 300nm |
|---|---|---|
| 0.2° | 1203 arcsec | 131 arcsec |
| 0.5° | 1238 arcsec | — |
| 1.0° | 488 arcsec | 122 arcsec |

Fig. 13B

Difference of Altitude in Measurement Region of AlN Layer
With thickness of 300nm

| Off Angle | Difference of Altitude (nm) |
|---|---|
| 0.2° | 41.7 |
| | 37.6 |
| 1.0° | 38.6 |
| | 36.5 |

Fig. 15

Difference of Altitude in Measurement Region and
Height of Cumulative Frequency of 90% where
Thickness of AlN Layer is 20 nm

| Off Angle | Difference of Altitude (nm) | Height of Cumulative Frequency of 90%(nm) |
|---|---|---|
| 0.2° | 16.8 | 5.30 |
|  | 18.9 | 5.77 |
| 0.5° | 17.3 | 5.83 |
|  | 18.4 | 4.80 |
| 1.0° | 17.3 | 5.41 |
|  | 18.3 | 5.45 |

Fig. 16

TEMPLATE, NITRIDE SEMICONDUCTOR ULTRAVIOLET LIGHT-EMITTING ELEMENT, AND METHOD OF MANUFACTURING TEMPLATE

TECHNICAL FIELD

The present invention relates to a template including a sapphire substrate and a method of manufacturing the template, and a nitride semiconductor ultraviolet light-emitting element including the template. In particular, the present invention relates to a template for a nitride semiconductor ultraviolet light-emitting element that has a peak emission wavelength in an ultraviolet region and a method of manufacturing the template, and the nitride semiconductor ultraviolet light-emitting element.

BACKGROUND ART

As a template of a nitride semiconductor ultraviolet light-emitting element including an AlGaN-based nitride semiconductor in an active layer, a template in which an AlN layer is epitaxially grown on a main surface of a sapphire substrate is often used.

In a semiconductor light-emitting element produced by epitaxially growing a plurality of semiconductor layers sequentially, the crystallinity of an underlying semiconductor layer will have a great influence on the crystallinity of a semiconductor layer thereon. Therefore, the crystallinity of a surface of the template, which has an influence on the crystallinity of the overall semiconductor light-emitting element, is particularly important. As the crystallinity of the surface of the template improves, the crystallinity of each semiconductor layer (in particular, active layer) included in the semiconductor light-emitting element also improves, and recombination of electrons and holes causing light emission becomes difficult to be inhibited by crystal defects, leading to better characteristics such as light emission efficiency.

However, there is a problem that in the template produced by epitaxially growing the AlN layer on the main surface of the sapphire substrate, it is difficult to obtain the AlN layer with good crystallinity for reasons such as lattice mismatch between sapphire and AlN, and difficulty in migration of Al atoms.

Regarding this problem, Patent Documents 1 and 2 and Non-Patent Document 1 propose a method of manufacturing a template in which the crystallinity of an AlN layer is improved by devising the supply timing of source gases at a time of growing the AlN layer. Here, the method of manufacturing a template proposed in Patent Documents 1 and 2 and Non-Patent Document 1 will be described with reference to the drawings. FIG. 14 is a schematic diagram illustrating a conventional method of manufacturing a template and is part of FIG. 3 described in a special feature article of Mr. Hideki Hirayama, who is one of inventors of Patent Documents 1 and 2 and one of authors of Non-Patent Document 1 (pages 2 to 5 of RIKEN NEWS June, 2011).

The method of manufacturing a template proposed in Patent Documents 1 and 2 and Non-Patent Document 1 is, after first forming several AlN crystalline nuclei on a main surface of a sapphire substrate (first stage of FIG. 14), to supply an N source gas (ammonia) in pulses while supplying an Al source gas continuously, thereby growing an AlN layer that fills a space between the AlN crystalline nuclei (second stage of FIG. 14). The AlN layer grown by such a method has less threading dislocations than the AlN layer grown in a form of a film on the main surface of a sapphire substrate. Then, after that, a film thickness of the AlN layer is increased and a surface is made flat (third stage of FIG. 14). Note that the method of manufacturing a template proposed in Patent Document 1 and Non-Patent Document 1 supplies, while increasing the film thickness of the AlN layer, the source gases by a method similar to the second stage of FIG. 14, thereby promoting lateral growth of the AlN crystals (fourth stage of FIG. 14). Accordingly, as the AlN layer grows, the threading dislocations that propagate upward are bent laterally, resulting in improvement in the crystallinity in the final surface of the AlN layer.

PRIOR ART DOCUMENTS

Patent Documents

Patent Document 1: Japanese Patent Application Publication No. 2009-54780
Patent Document 2: WO 2013/005789

Non-Patent Document

Non-Patent Document 1: Physica Status Solidi, A206, No. 6, 1176-1182 (2009)

SUMMARY OF THE INVENTION

Problems to be Solved by the Invention

However, the method of manufacturing a template proposed in Patent Documents 1 and 2 and Non-Patent Document 1 does not significantly change a growth mode of AlN crystals from the conventional mode, and is limited to reduction in the threading dislocations, which has been conventionally considered to cause decrease in the crystallinity of the AlN layer, not leading to a dramatic improvement in the crystallinity of the AlN layer.

Therefore, an object of the present invention is to provide a template that dramatically improves the crystallinity of the AlN layer by greatly changing the growth mode of AlN crystals from the conventional mode and a method of producing the same, and a nitride semiconductor ultraviolet light-emitting element including the template.

Means for Solving the Problem

To achieve the above object, the present invention provides a template comprising: a sapphire substrate with one of a (0001) plane and a plane inclined by a predetermined angle with respect to the (0001) plane as a main surface; and an AlN layer formed directly on the main surface of the sapphire substrate and composed of AlN crystals having an epitaxial crystal orientation relationship with respect to the main surface, wherein an average particle diameter of the AlN crystals of the AlN layer at a thickness of 20 nm from the main surface is 100 nm or less.

Furthermore, in the template, the average particle diameter of the AlN crystals of the AlN layer at a thickness of 20 nm from the main surface may be 75 nm or less and may be 70 nm or less. Furthermore, in the template, the average particle diameter of the AlN crystals of the AlN layer at a thickness of 300 nm from the main surface may be 300 nm or less.

Furthermore, in the template, the main surface of the sapphire substrate may be a plane inclined by 0.2° or more with respect to the (0001) plane. With this template, the AlN crystals having a small average particle diameter as described above can be easily obtained.

Furthermore, in the template, the AlN crystals of the AlN layer at a thickness of 300 nm from the main surface may be +C-axis oriented upward of the sapphire substrate. With this template, the crystallinity of the AlN layer can be further improved.

Furthermore, the present invention provides a nitride semiconductor ultraviolet light-emitting element comprising: the template; and an element structure part including a plurality of AlGaN-based semiconductor layers stacked on the template.

Furthermore, the present invention provides a method of manufacturing a template, the method comprising a step of epitaxially growing AlN crystals directly on a main surface of a sapphire substrate with one of a (0001) plane and a plane inclined by a predetermined angle with respect to the (0001) plane as the main surface to form an AlN layer, wherein the step includes epitaxially growing the AlN crystals under a growth condition that an average particle diameter of the AlN crystals on a surface of the AlN layer epitaxially grown from the main surface to a thickness of 20 nm is 100 nm or less.

Furthermore, the present invention provides a method of manufacturing a template, the method comprising a step of epitaxially growing AlN crystals directly on a main surface of a sapphire substrate with one of a (0001) plane and a plane inclined by a predetermined angle with respect to the (0001) plane as the main surface to form an AlN layer, wherein the step includes epitaxially growing the AlN crystals under a growth condition that an average particle diameter of the AlN crystals on a surface of the AlN layer is 100 nm or less when the AlN layer covering 90% or more of the main surface is epitaxially grown to a thickness of 20 nm.

Furthermore, the step of the method of manufacturing a template may include epitaxially growing the AlN layer under a growth condition that the average particle diameter of the AlN crystals on the surface of the AlN layer epitaxially grown from the main surface to a thickness of 300 nm is 300 nm or less.

Furthermore, the step of the method of manufacturing a template may include epitaxially growing the AlN layer under a growth condition that an RMS value of surface roughness of the AlN layer epitaxially grown from the main surface to a thickness of 20 nm is equal to or less than an RMS value of surface roughness of the AlN layer epitaxially grown from the main surface to a thickness of 300 nm. For example, the step of the method of manufacturing a template may include epitaxially growing the AlN layer under a growth condition that the RMS value of surface roughness of the AlN layer epitaxially grown from the main surface to a thickness of 20 nm is 5 nm or less, and may include epitaxially growing the AlN layer under a growth condition that the RMS value of surface roughness of the AlN layer epitaxially grown from the main surface to a thickness of 300 nm is 10 nm or less.

Furthermore, the step of the method of manufacturing a template may include epitaxially growing the AlN layer under a growth condition that the AlN crystals on the surface of the AlN layer epitaxially grown from the main surface to a thickness of 300 nm are +C-axis oriented. By this method of manufacturing a template, the crystallinity of the AlN layer can be further improved.

Furthermore, the step of the method of manufacturing a template may include setting a growth temperature of the AlN layer at 1150° C. or higher and 1300° C. or lower. By this method of manufacturing a template, the AlN crystals can be epitaxially grown suitably on the main surface of the sapphire substrate.

Effects of the Invention

With the template and the method of manufacturing the template, the crystallinity of the AlN layer epitaxially grown on the main surface of the sapphire substrate can be dramatically improved. Also, the nitride semiconductor ultraviolet light-emitting element including this template, which improves the crystallinity of the element structure part, can improve characteristics such as light emission efficiency.

BRIEF DESCRIPTION OF THE DRAWINGS

FIG. 6 is tables illustrating a particle diameter of AlN crystals measured from the AFM image of the AlN layer having a thickness of 20 nm and grown on the main surface of the sapphire substrate with the off angle of 0.2°.

FIG. 7 is tables illustrating the particle diameter of the AlN crystals measured from the AFM image of the AlN layer having a thickness of 20 nm and grown on the main surface of the sapphire substrate with the off angle of 0.5°.

FIG. 8 is tables illustrating the particle diameter of the AlN crystals measured from the AFM image of the AlN layer having a thickness of 20 nm and grown on the main surface of the sapphire substrate with the off angle of 1.0°.

FIG. 9 is tables illustrating measurement results of the particle diameter of the AlN crystals illustrated in FIGS. 6 to 8 together with the particle diameter of the AlN crystals and RMS values of surface roughness of the AlN layer measured with an AFM device.

FIGS. 12A and 12B are diagrams illustrating a comparison between the AlN layer in the template according to the embodiment of the present invention, and the AlN layer in the conventional template described in Patent Document 1 and Non-Patent Document 1.

FIGS. 13A and 13B are tables illustrating measurement results by the XRC method on the (0002) plane of the AlN layer in the template according to the embodiment of the present invention.

FIG. 15 is a table illustrating a difference of altitude in a measurement region of the AlN layer with a thickness of 300 nm in the template according to the embodiment of the present invention.

FIG. 16 is a table illustrating the difference of altitude in the measurement region of the AlN layer with a thickness of 20 nm and a height of a cumulative frequency of 90% in the template according to the embodiment of the present invention.

DESCRIPTION OF EMBODIMENT

When describing an embodiment of the present invention, a nitride semiconductor ultraviolet light-emitting element, which is a light-emitting diode, and a method of manufacturing the same will be illustrated below. The light-emitting diode includes a template including a sapphire substrate, and an element structure part including a plurality of AlGaN-based semiconductor layers stacked on the template. The light-emitting diode emits light having a peak emission wavelength of 365 nm or less (ultraviolet) by turning on electricity. Note that the AlGaN-based semiconductor that is a material constituting each of the AlGaN-based semiconductor layers included in the element structure part refers to AlGaN, AlN, or GaN, or a semiconductor of AlGaN, AlN, or GaN containing a small amount of impurities (e.g., Si, Mg, In, and the like). Hereinafter, subscripts used for Al and Ga as necessary represent relative composition ratios of Al and Ga (e.g., $Al_XGa_{1-X}N$).

However, since the present invention mainly relates to a template, the structure of the element structure part on the template may be any structure, and is not limited to the structure exemplified in the following section "Nitride semiconductor ultraviolet light-emitting element."

<Nitride Semiconductor Ultraviolet Light-Emitting Element>

Figure 1:
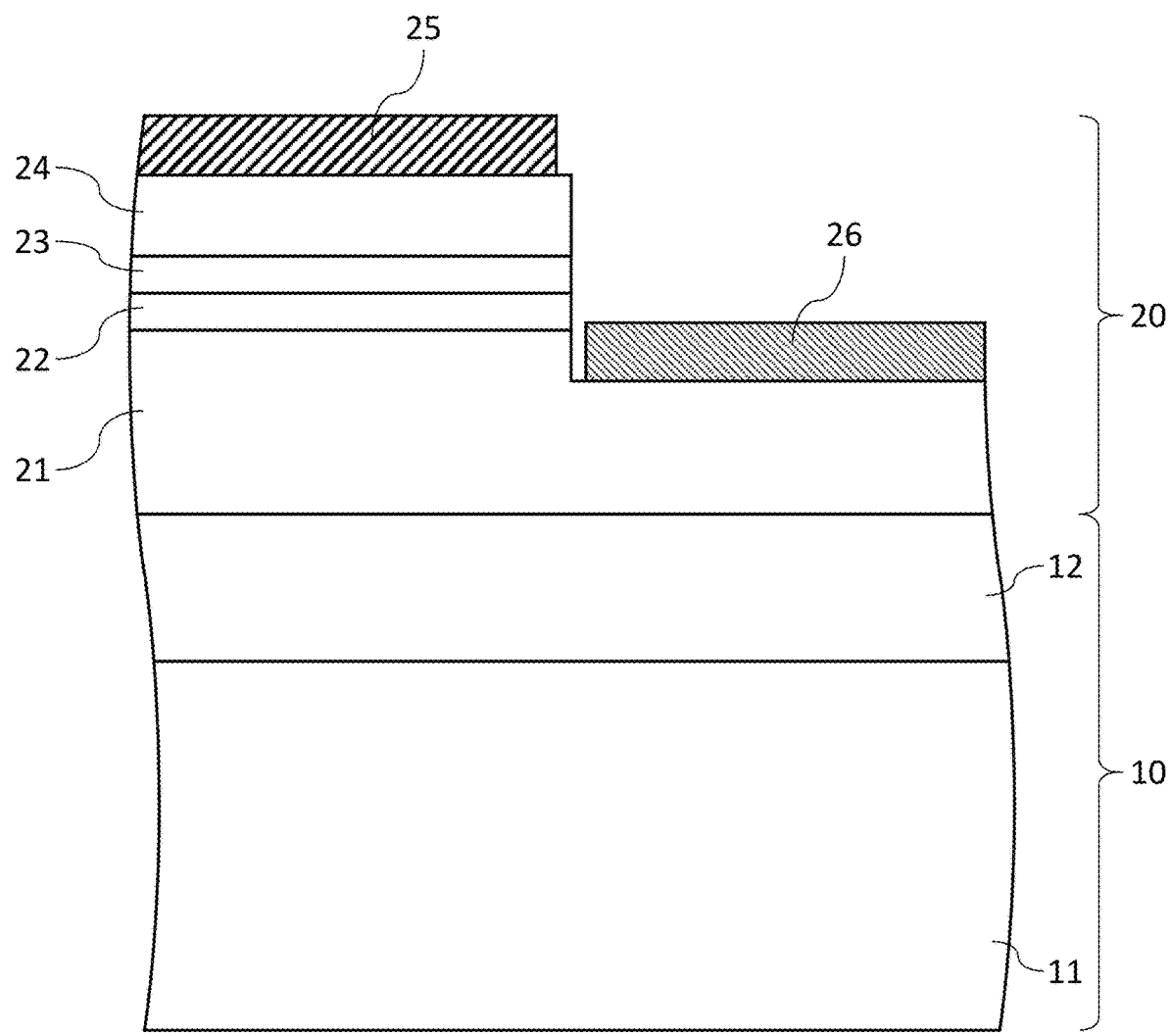
FIG. 1 is a cross-sectional view of a main part schematically illustrating one example of a structure of a nitride semiconductor ultraviolet light-emitting element according to an embodiment of the present invention.
Figure 2:
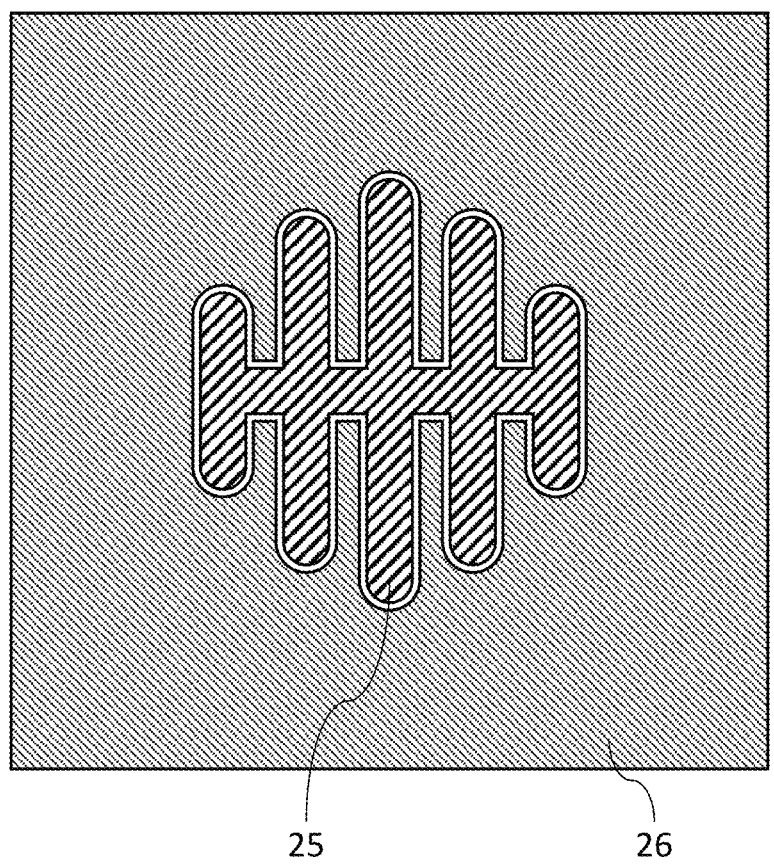
FIG. 2 is a plan view schematically illustrating one example of the structure of the nitride semiconductor ultraviolet light-emitting element illustrated in FIG. 1 when viewed from an upper side of FIG. 1.

First, one example of the structure of the nitride semiconductor ultraviolet light-emitting element according to the embodiment of the present invention will be described with reference to the drawings. FIG. 1 is a cross-sectional view of a main part schematically illustrating one example of the structure of the nitride semiconductor ultraviolet light-emitting element according to the embodiment of the present invention. FIG. 2 is a plan view schematically illustrating one example of the structure of the nitride semiconductor ultraviolet light-emitting element illustrated in FIG. 1 when viewed from an upper side of FIG. 1. Note that since FIG. 1 schematically illustrates thicknesses of a substrate, AlGaN-based semiconductor layers, and electrodes (vertical lengths in the figure) for convenience of illustration, FIG. 1 does not necessarily agree with an actual dimensional ratio. Also, in the following description, an AlGaN-based semiconductor having description of neither p-type nor n-type is an undoped semiconductor, but even the undoped semiconductor can contain a small amount of impurities that is unavoidably mixed.

As illustrated in FIGS. 1 and 2, a nitride semiconductor ultraviolet light-emitting element 1 according to the embodiment of the present invention includes a template 10 including a sapphire substrate 11, and an element structure part 20 including a plurality of AlGaN-based semiconductor layers 21 to 24 and electrodes 25 and 26. This nitride semiconductor ultraviolet light-emitting element 1 is mounted (flip-chip mounted) with an element structure part 20 side (upper side in the figure in FIG. 1) facing a mounting base, and a light extraction direction is a template 10 side (lower side in the figure in FIG. 1).

The template 10 includes the sapphire substrate 11 with the (0001) plane or a plane inclined by a predetermined angle (off angle) with respect to the (0001) plane as a main surface, and an AlN layer 12 directly formed on the main surface of the sapphire substrate 11. The AlN layer 12 is composed of AlN crystals epitaxially grown from the main surface of the sapphire substrate 11, and these AlN crystals have an epitaxial crystal orientation relationship with respect to the main surface of the sapphire substrate 11. Specifically, for example, the AlN crystals grow such that the C axis direction of the sapphire substrate 11 (<0001> direction) and the C axis direction of the AlN crystals are aligned. Note that the AlN crystals constituting the AlN layer 12 may contain a small amount of Ga and other impurities. In addition, a layer composed of an $Al_\alpha Ga_{1-\alpha}N$ ($1>\alpha>0$)-based semiconductor may further be formed on an upper surface of the AlN layer 12.

The element structure part 20 has a structure in which an n-type cladding layer 21, an active layer 22, an electron blocking layer 23, and a p-type contact layer 24 are epitaxially grown and stacked in order from the template 10 side.

The n-type cladding layer 21 is composed of an n-type $Al_XGa_{1-X}N$ ($1 \geq X > 0$)-based semiconductor. The active layer 22 has a single or multiple quantum well structure obtained by alternately laminating one or more well layers composed of an $Al_{Y1}Ga_{1-Y1}N$-based semiconductor ($X>Y1\geq 0$) and one or more barrier layers composed of $Al_{Y2}Ga_{1-Y2}N$ ($X \geq Y2 > Y1$). The electron blocking layer 23 is composed of a p-type $Al_ZGa_{1-Z}N$ ($1 \geq Z \geq Y2$)-based semiconductor. The p-type contact layer 24 is composed of a p-type $Al_QGa_{1-Q}N$ ($Z>Q\geq 0$)-based semiconductor.

Furthermore, the element structure part 20 includes the p-electrode 25 composed of, for example, Ni/Au and formed on the upper surface of the p-type contact layer 24, and the n-electrode 26 composed of, for example, Ti/Al/Ti/Au and formed on the upper surface of the n-type cladding layer 21 in certain region where the n-type cladding layer 21 is exposed. When electric power is applied such that holes are supplied from the p-electrode 25 and electrons are supplied from the n-electrode 26, the supplied holes and electrons reach the active layer 22 and recombine to emit light.

Next, one example of a method of manufacturing the nitride semiconductor ultraviolet light-emitting device 1 illustrated in FIG. 1 will be described.

First, by a well-known epitaxial growth method such as metal organic vapor phase epitaxy (MOVPE) and molecular beam epitaxy (MBE), the AlN layer 12 included in the template 10 and the AlGaN-based semiconductor layers 21 to 24 included in the element structure part 20 are epitaxially grown and stacked sequentially on the sapphire substrate 11. At this time, for example, Si is doped as a donor impurity into the n-type layer, and for example, Mg is doped as an acceptor impurity into the p-type layer.

Next, by a well-known etching method such as reactive ion etching, some region of the stacked semiconductor layers as described above is selectively etched to expose the n-type cladding layer 21 of the region. Then, by a well-known film formation method such as an electron beam evaporation method, the p-electrode 25 is formed on the p-type contact layer 24 within a region that is not etched, and the n-electrode 26 is formed on the n-type cladding layer 21 within the etched region. Note that after the formation of one or both of the p-electrode 25 and the n-electrode 26, heat treatment may be performed by a well-known heat treatment method such as rapid thermal annealing (RTA).

<Template>

Next, the above-described template 10 will be described. Note that the template 10 according to the embodiment of the present invention is characterized by the AlN layer 12 formed on the main surface of the sapphire substrate 11, and any sapphire substrate can be used for the sapphire substrate 11 as long as the AlN layer 12 can be epitaxially grown (cab be particularly grown in the C-axis direction).

The template 10 according to the embodiment of the present invention is largely different from the template proposed in Patent Documents 1 and 2 and Non-Patent Document 1 in that a particle diameter of the AlN crystals formed on the main surface of the sapphire substrate 11 is made as small as possible. The particle diameter of the AlN crystals is determined depending on various growth conditions, such as, for example, the off angle and a growth temperature (substrate temperature) of the sapphire substrate 11, a supply amount and a supply ratio of a raw material (V/III ratio), and a supply amount of a carrier gas, and the particle diameter can vary depending on a film forming device to use. Note that as in the template proposed in Patent Documents 1 and 2 and Non-Patent Document 1, for forming AlN crystalline nuclei on a sapphire substrate and growing an AlN layer so as to fill the space between the AlN crystalline nuclei, a special growth method (pulse supply of ammonia) is required when growing the AlN layer; however, for making the particle diameter of individual AlN crystals as small as possible as in the template 10 according to the embodiment of the present invention, no special growth method is required, and it is required at least to suitably explore, by experiments or the like, and employ appropriate growth conditions suitable for the film forming device to use. However, for growing the AlN layer particularly by the MOVPE method, from the viewpoint of epitaxially growing the AlN crystals suitably on the main surface of the sapphire substrate 11, it is preferable to set the growth temperature at 1150° C. or higher and 1300° C. or lower, and more preferably higher than 1200° C. and lower than 1300° C.

Figure 3:
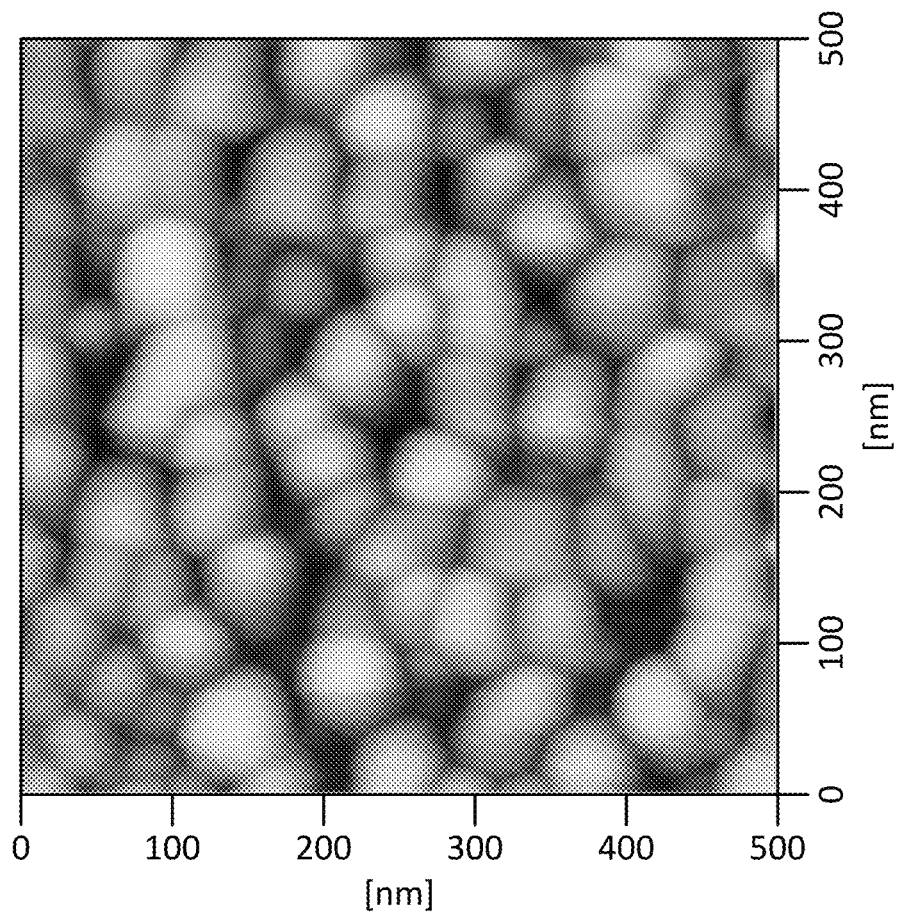
FIG. 3 is an AFM image of an AlN layer having a thickness of 20 nm and grown on a main surface of a sapphire substrate with an off angle of 0.2°.
Figure 4:
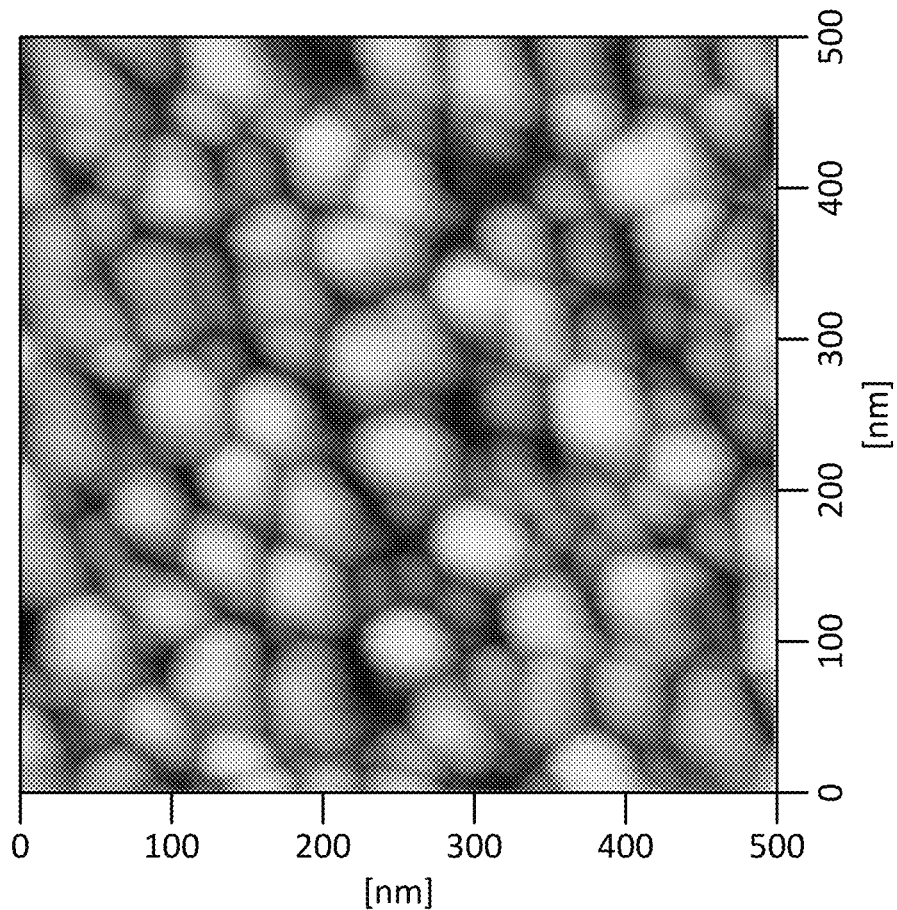
FIG. 4 is an AFM image of the AlN layer having a thickness of 20 nm and grown on the main surface of the sapphire substrate with the off angle of 0.5°.
Figure 5:
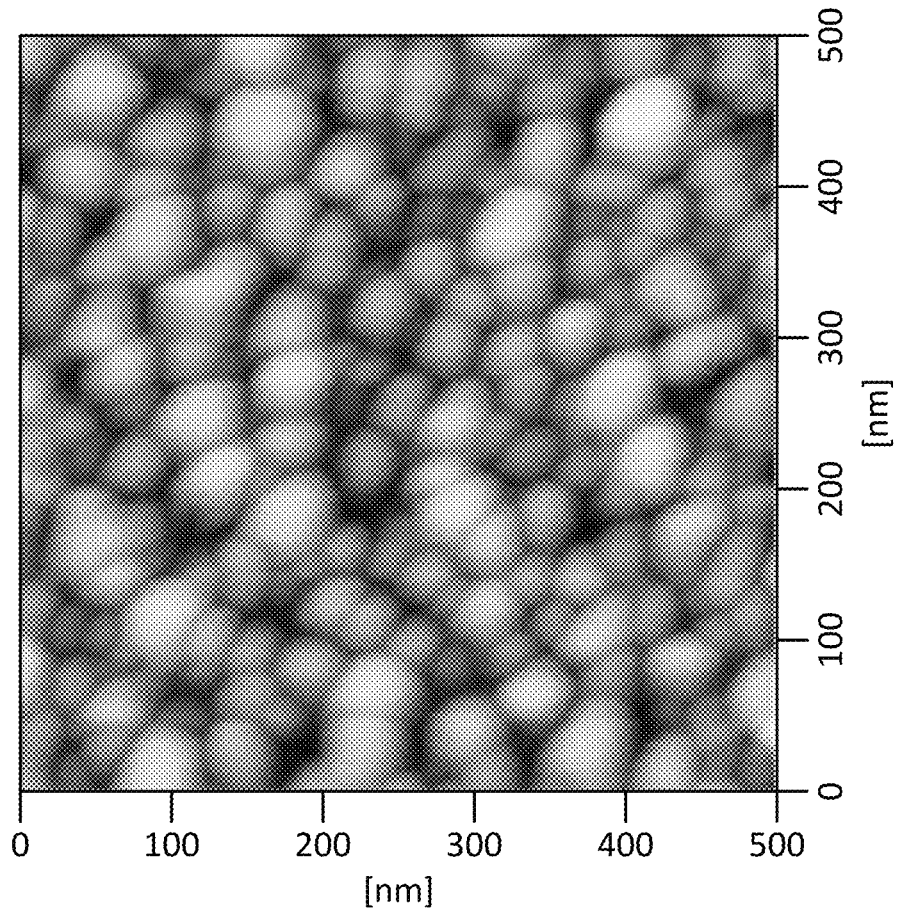
FIG. 5 is an AFM image of the AlN layer having a thickness of 20 nm and grown on the main surface of the sapphire substrate with the off angle of 1.0°.

FIGS. 3 to 5 are atomic force microscope (AFM) images of the surface of the AlN layer grown to a thickness of 20 nm in the template according to the embodiment of the present invention. FIG. 3 is an AFM image of the AlN layer having a thickness of 20 nm and grown on the main surface of the sapphire substrate with the off angle of 0.2°. FIG. 4 is an AFM image of the AlN layer having a thickness of 20 nm and grown on the main surface of the sapphire substrate with the off angle of 0.5°. FIG. 5 is an AFM image of the AlN layer having a thickness of 20 nm and grown on the main surface of the sapphire substrate with the off angle of 1.0°.

FIGS. 6 to 9 are tables illustrating the particle diameter of the AlN crystals measured from the AFM images of the surface of the AlN layer grown to a thickness of 20 nm in the template according to the embodiment of the present invention. FIG. 6 is tables illustrating the particle diameter of the AlN crystals measured from the AFM image of the AlN layer having a thickness of 20 nm and grown on the main surface of the sapphire substrate with the off angle of 0.2°. FIG. 7 is tables illustrating the particle diameter of the AlN crystals measured from the AFM image of the AlN layer having a thickness of 20 nm and grown on the main surface of the sapphire substrate with the off angle of 0.5°. FIG. 8 is tables illustrating the particle diameter of the AlN crystals measured from the AFM image of the AlN layer having a thickness of 20 nm and grown on the main surface of the sapphire substrate with the off angle of 1.0°. FIG. 9 is tables illustrating measurement results of the particle diameter of the AlN crystals illustrated in FIGS. 6 to 8 together with the particle diameter of the AlN crystals and root mean square (RMS) values of surface roughness of the AlN layer measured with the AFM device.

The measurement results illustrated in FIGS. 6 to 8 are results of dividing an AFM image measurement region having a size of 500 nm×500 nm into 25 small regions of 100 nm×100 nm, and measuring one by one the particle diameter of the AlN crystals included in each small region. Note that the AlN crystal positioned on a boundary of the small region is distributed to a small region in which a portion equal to or greater than half of the AlN crystal is included, whereas the AlN crystal positioned on a boundary of the measurement region is neglected because the particle diameter cannot be measured. In addition, since the AlN crystal in the AFM image is generally considered circular or elliptical (strictly speaking, the AlN crystal is considered to have a shape close to a hexagon, and sides (facets) are visible in some particles, but the AlN crystal appears to be circular or elliptical for reasons such as the limitation of performance of the AFM device), an average value of a major axis length and a minor axis length is defined as the particle diameter. In addition, as illustrated in FIGS. 6 to 8, for each of three types of samples (wafers) having the off angle of the sapphire substrate 11 of 0.2°, 0.5°, and 1.0°, the particle diameter of the AlN crystals is measured from each AFM image of different measurement regions 1 to 3 on the wafer.

In FIG. 9, the average particle diameter and standard deviation of "individual measurement values" refer to values obtained by measuring the AlN crystals one by one in the AFM images as illustrated in FIGS. 6 to 8. Meanwhile, the average particle diameter, standard deviation, and RMS value of surface roughness of "device measurement values" are values measured with the AFM device (probe station: NanoNavills, scanning probe microscope unit: NanoCute, and software: NanoNaviStation ver 5.6B). The AFM device regards, as one particle, one closed region in which a height at each measurement point in the measurement region is equal to or higher than a predetermined threshold height (e.g., an intermediate value such as average and median), detects the number of particles and the particle gross area, and calculates a circle diameter that has an average particle area obtained by dividing the particle gross area by the number of particles as the average particle diameter. Furthermore, this AFM device calculates standard deviation of the particle area. The value obtained by converting the standard deviation of the particle area into the standard deviation of the circle diameter is the standard deviation of the particle diameter of "the device measurement value" in FIG. 9. In addition, the RMS value of surface roughness is a value of Rq calculated by the following formula (1). Note that in the following formula (1), Z (i) is the height at each measurement point in the measurement region, n is the number of measurement points in the measurement region, and Ze is the average value of the height at each measurement point in the measurement region.

$$Ze = \frac{1}{n}\sum_{i=1}^{n} Z(i),\ Rq = \sqrt{\frac{1}{n}\sum_{i=1}^{n}(Z(i)-Ze)^2} \quad (1)$$

As illustrated in FIGS. 3 to 5 and FIGS. 6 to 8, in any of samples in which the off angles of the sapphire substrate 1 are 0.2°, 0.5° and 1.0°, the AlN crystals having a particle diameter of approximately 20 nm or more and 100 nm or less are densely packed. In addition, as illustrated in FIG. 9, the average particle diameter of the AlN crystals obtained by measuring the AlN crystals in the AFM image one by one, and the average particle diameter of the AlN crystals measured with the AFM device have similar sizes, and it can be said that the average particle diameters of the AlN crystals measured by either method are appropriate values.

Figure 10:
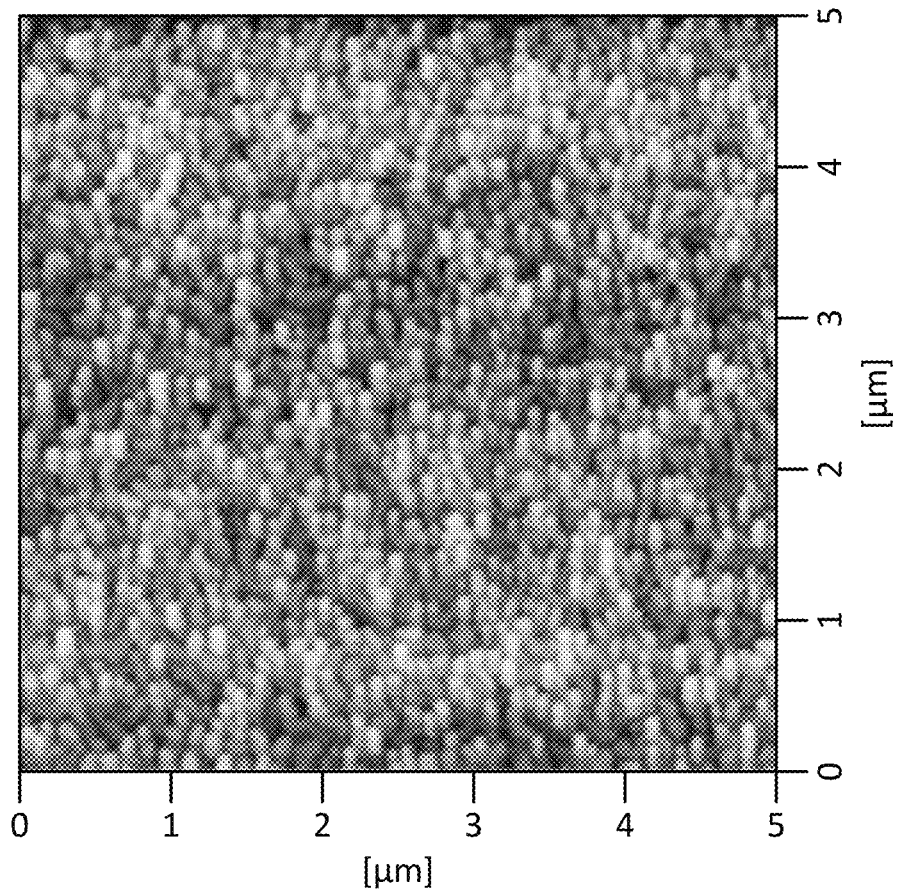
FIG. 10 is an AFM image of the AlN layer having a thickness of 300 nm and grown on the main surface of the sapphire substrate with the off angle of 0.2°, and a table illustrating the particle diameter of the AlN crystals and the RMS value of surface roughness of the AlN layer measured with the AFM device.
Figure 11:
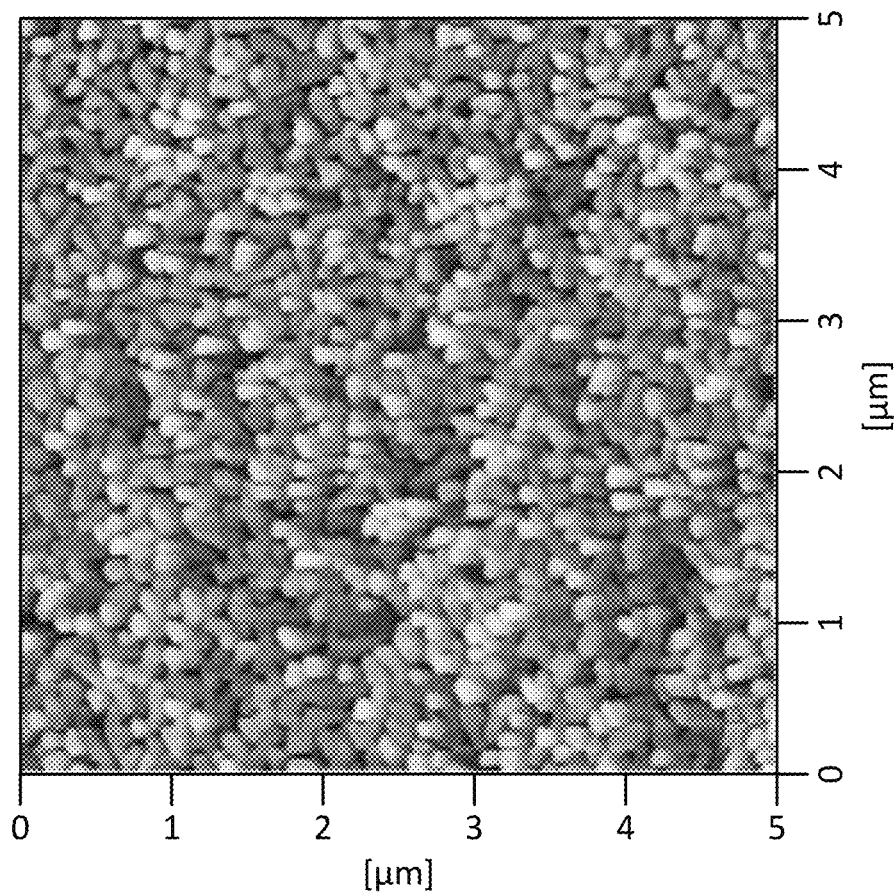
FIG. 11 is an AFM image of the AlN layer having a thickness of 300 nm and grown on the main surface of the sapphire substrate with the off angle of 1.0°, and a table illustrating the particle diameter of the AlN crystals and the RMS value of surface roughness of the AlN layer measured with the AFM device.

FIGS. 10 and 11 are diagrams each illustrating the AFM image of the AlN layer grown to a thickness of 300 nm and the particle diameter and the RMS value of surface roughness measured with the AFM device in the template according to the embodiment of the present invention. FIG. 10 is an AFM image of the AlN layer having a thickness of 300 nm and grown on the main surface of the sapphire substrate with the off angle of 0.2°, and a table illustrating the particle diameter of the AlN crystals and the RMS value of surface roughness of the AlN layer measured with the AFM device. FIG. 11 is an AFM image of the AlN layer having a thickness of 300 nm and grown on the main surface of the sapphire substrate with the off angle of 1.0°, and a table illustrating the particle diameter of the AlN crystals and the RMS value of surface roughness of the AlN layer measured with the AFM device.

Here, with reference to the drawings, a comparison result will be described between the AlN layer in the template according to the embodiment of the present invention and the AlN layer in the conventional template described in Patent Document 1 and Non-Patent Document 1. FIGS. 12A and 12B are diagrams illustrating a comparison between the AlN layer in the template according to the embodiment of the present invention and the AlN layer in the conventional template described in Patent Document 1 and Non-Patent Document 1. Note that FIG. 12A is an AFM image of the AlN layer in the conventional template described in Patent Document 1 and Non-Patent Document 1. FIG. 12B is a diagram illustrating a comparison, in the same size (2 μm×2 μm), between the AFM image of the AlN layer in the template according to the embodiment of the present invention (a figure in which the plurality of AFM images of FIG. 3 are arranged, and part of the AFM image of FIG. 10), and the AFM image of the AlN layer in the conventional template described in Patent Document 1 and Non-Patent Document 1 (part of the AFM image of FIG. 12A).

The AFM image of the AlN layer in the conventional template described in Patent Document 1 and Non-Patent Document 1 illustrated in FIG. 12A is an AFM image of an AlN nucleation layer formed on the main surface of the sapphire substrate (layer in an initial stage in the AlN layer having a thickness of 300 nm and first formed on the main surface of the sapphire substrate), and corresponds to a state of the template in FIGS. 3 to 5 (thickness: 20 nm) according to the embodiment of the present application. In the AFM image illustrated in FIG. 12A, some AlN crystals are combined and grow huge to about several micrometers, and it is difficult to measure the particle diameter before the combination, but a relatively small AlN crystal that is considered not combined also has an average particle diameter of about 1000 nm.

As is apparent from comparison results of the AFM images illustrated in FIG. 12B, the average particle diameter of the AlN crystals in the AlN layer of the template according to the embodiment of the present invention is significantly smaller than the average particle diameter of the AlN crystals in the AlN layer of the template described in Patent Document 1 and Non-Patent Document 1.

Specifically, in the template described in Patent Document 1 and Non-Patent Document 1, the average particle diameter of the AlN crystals in a growth start stage of the AlN layer is about 1000 nm. Furthermore, in the template described in Patent Document 1 and Non-Patent Document 1, when the thickness of the AlN layer becomes 300 nm, the plurality of AlN crystals is completely combined into a film state, in which individual crystals cannot be observed. In contrast, in the template according to the embodiment of the present invention, the average particle diameter of the AlN crystals in the growth start stage of the AlN layer (thickness: 20 nm) is only about 50 nm. Furthermore, in the template according to the embodiment of the present invention, even when the thickness of the AlN layer becomes 300 nm, individual crystals are sufficiently observable, and the average particle diameter is only about 200 nm.

Also, in the template described in Patent Document 1 and Non-Patent Document 1, it is presumed that the RMS value of surface roughness in the growth start stage of the AlN layer is 21.4 nm, and that the RMS value of surface roughness in the stage when the thickness of the AlN layer becomes 300 nm is a value between 21.4 nm and 8.2 nm (see FIG. 4B of Patent Document 1). Meanwhile, in the template according to the embodiment of the present invention, the RMS value of surface roughness in the growth start stage of the AlN layer (thickness: 20 nm) is about 3 nm, and the RMS value of surface roughness in the stage when the thickness of the AlN layer becomes 300 nm is about 5 nm. Therefore, the RMS value of surface roughness in the AlN layer of the template according to the embodiment of the present invention is significantly smaller than the RMS value of surface roughness in the AlN layer of the template described in Patent Document 1 and Non-Patent Document 1.

In particular, in the template described in Patent Document 1 and Non-Patent Document 1, relatively large AlN crystalline nuclei stand out everywhere in the growth start stage of the AlN layer, and the film-like AlN layer is formed so as to fill the space between the AlN crystalline nuclei, and thus the RMS value of surface roughness of the AlN layer becomes relatively large. After that, since the space between individual AlN crystalline nuclei are completely filled with the film-like AlN layer, the RMS value of surface roughness of the AlN layer simply decreases with the growth of the AlN layer (increase in thickness). Meanwhile, in the template according to the embodiment of the present invention, since the fine initial AlN crystals are grown in large quantity and high density, the RMS value of surface roughness in the growth start stage of the AlN layer becomes relatively small. After that, since individual AlN crystals are combined or become coarse afterwards, the RMS value of surface roughness of the AlN layer in this stage (stage when the thickness of the AlN layer becomes 300 nm) is equal to or greater than the RMS value of surface roughness of the AlN layer in the growth start stage.

As described above, the growth mode of the AlN crystals in the growth start stage of the AlN layer is fundamentally different between the template described in Patent Documents 1 and 2 and Non-Patent Document 1 and the template according to the embodiment of the present invention, and the difference therebetween is shown in the average particle diameter of the AlN crystals and the RMS value of surface roughness of the AlN layer. Note that even with the template according to the embodiment of the present invention, when the AlN layer is further grown (thickness is made larger than 300 nm, for example, 1 μm or more, preferably 2 μm or more), individual AlN crystals are gradually combined, and finally the film-like AlN layer is obtained.

Next, the crystallinity of the AlN layer in the template according to the embodiment of the present invention will be described with reference to the drawings. FIGS. 13A and 13B are tables illustrating measurement results by the X-ray rocking curve (XRC) method on the (0002) plane of the AlN layer in the template according to the embodiment of the present invention. Note that FIG. 13A is a table illustrating the measurement result of ω scan, FIG. 13B is a table illustrating the measurement result of 2θ-ω scan, and numerical values described in each table are average values of the full width at half maximum (FWHM) of the peak corresponding to the (0002) plane. Also, in measurement of ω scan illustrated in FIG. 13A, if axis alignment is performed to align the C axis of a sample (C axis of the sapphire substrate and the AlN layer) with the X-ray specular reflection axis, specular reflection of the X-ray by the sapphire substrate is measured, and it becomes difficult to measure the full width at half maximum of the AlN layer, and thus measurement is carried out without performing such axis alignment.

As illustrated in FIGS. 13A and 13B, in the measurement results of both ω scan and 2θ-ω scan, when the thickness of the AlN layer is 20 nm, the full width at half maximum of the (0002) plane is about 1000 arcsec. Also, as illustrated in FIG. 13B, in the measurement result of 2θ-ω scan, when the thickness of the AlN layer is 300 nm, the full width at half maximum of the (0002) plane is about 100 arcsec.

Usually, the full width at half maximum of the (0002) plane in the AlN layer grown on the (0001) plane of the sapphire substrate by about several micrometers without particularly restricting the particle diameter of the AlN crystals is about 2000 arcsec. In contrast, Non-Patent Document 1 reports that the full width at half maximum of the (0002) plane in the AlN layer grown to a thickness of 4.8 μm has improved to about 200 arcsec, by forming a small number of AlN crystalline nuclei in the growth start stage of the AlN layer, growing the film-like AlN layer filling the AlN crystalline nuclei, and further promoting lateral growth during the growth of the AlN layer.

Compared with these conventional techniques, in the template according to the embodiment of the present invention, the full width at half maximum of the (0002) plane in the growth start stage of the AlN layer (thickness: 20 nm) is already as small as 1000 arcsec, and the full width at half maximum of the (0002) plane in the AlN layer grown to a thickness of 300 nm is smaller, as small as 100 arcsec. That is, by merely growing the AlN layer to only about 300 nm, the template according to the embodiment of the present invention can achieve the crystallinity equal to or higher than the crystallinity that cannot be achieved without growing the AlN layer to a thickness of 4.8 μm in the template described in Patent Document 1 and Non-Patent Document 1. In addition, in the template according to the embodiment of the present invention, further improvement in the crystallinity is expected by growing the AlN layer more thickly.

As described above, by making the average particle diameter of the AlN crystals epitaxially grown on the main surface of the sapphire substrate sufficiently smaller than the average particle diameter of the AlN crystals in the AlN layer of the template described in Patent Document 1 and Non-Patent Document 1 (furthermore, Patent Document 2 in which the AlN layer is formed by a similar method), the crystallinity of the AlN layer epitaxially grown on the main surface of the sapphire substrate can be dramatically improved.

Note that considering a range and deviation of the average particle diameter and variation in the particle diameter of the AlN crystals in the template according to the embodiment of the present invention illustrated in FIGS. 6 to 12, the divergence of the particle diameter of the AlN crystals in each of the template according to the embodiment of the present invention and the template described in Patent Document 1 and Non-Patent Document 1, and the like, it is considered that the above effect can be obtained by setting the average particle diameter of the AlN crystals at 100 nm or less in the growth start stage of the AlN layer (thickness: 20 nm). In particular, in FIGS. 6 to 8, since the average value of the maximum value in the particle diameter of the AlN crystals is about 75 nm at the most, it is preferable to set the average particle diameter of the AlN crystals at 75 nm or less, and more preferable at 70 nm or less. Also, it is preferable to set the average particle diameter at 20 nm or more, and in particular, in FIGS. 6 to 8, since the average value of the minimum value in the particle diameter of the AlN crystals is about 28 nm, it is more preferable to set the average particle diameter of the AlN crystals at 28 nm or more. Similarly, it is considered that the above effect can be obtained by setting the average particle diameter of the AlN crystals in the AlN layer having a thickness of 300 nm at 300 nm or less, and it is more preferable to set the average particle diameter at 250 nm or less. Also, it is preferable to set this average particle diameter at 150 nm or more.

Also, considering the RMS value of surface roughness of the AlN layer in the template according to the embodiment of the present invention illustrated in FIGS. 9 to 12 and the divergence of the RMS value of surface roughness of the AlN layer in each of the template according to the embodiment of the present invention and the template described in Patent Document 1 and Non-Patent Document 1, it is considered that the above effect can be obtained by setting the RMS value of surface roughness of the AlN layer in the growth start stage of the AlN layer (thickness: 20 nm) at 5 nm or less, and it is more preferable to set this RMS value at 4 nm or less. Also, it is preferable to set this RMS value at 2 nm or more. Similarly, it is considered that the above effect can be obtained by setting the RMS value of surface roughness of the AlN layer having a thickness of 300 nm at 10 nm or less, and it is more preferable to set the RMS value at 6 nm or less. Also, it is preferable to set this RMS value at 4 nm or more.

Note that AlN, which has a wurtzite structure, has a crystalline structure asymmetric in the C-axis direction (vertically asymmetric crystalline structure when the C axis is selected as the vertical direction), the +C-axis direction ([0001] direction) and the −C-axis direction ([000-1] direction) are not equivalent, and the +C plane ((0001) plane: Al polarity plane) and the −C plane ((000-1) plane: N polarity plane) are also not equivalent. When the AlN crystals are epitaxially grown on the (0001) plane of the sapphire substrate, the AlN crystals growing in the +C-axis direction and the AlN crystals growing in the −C-axis direction can be mixed.

Regarding this, if the AlN crystals constituting the AlN layer are +C-axis oriented toward the upper side of the substrate (if the main growth direction of the AlN crystals is the +C axis direction and the entire surface or most part (for example, 80% or more, preferably 90% or more) of the surface of the AlN layer is the +C plane), it is preferable because the crystallinity of the AlN layer can be further improved.

As one example of a method of making the AlN crystals +C-axis oriented, for example, a method employed in Applied Physics Express 4 (2011) 092102 is considered. In addition, for example, when the AlN layer is epitaxially grown on the sapphire substrate by the MOVPE method, by starting supply of an Al source gas (e.g., TMA: TriMethyl-Aluminium) at the same time or earlier than the N source gas (e.g., ammonia), a method of suppressing excessive nitriding of the main surface of the sapphire substrate and making the AlN layer +C-axis oriented is considered. Note that the template according to the above-described embodiment is obtained by growing the AlN layer with the latter method, at least 50% of the surface of the AlN layer grown to a thickness of 20 nm from the main surface of the sapphire substrate is the +C plane, and at least 80% of the surface of the AlN layer grown to a thickness of 300 nm is the +C plane (+C-axis oriented).

Also, in the embodiment described above, description has been made of the template having the off angle of the sapphire substrate of 0.2°, 0.5°, and 1.0°; however, as long as AlN crystals similar to the above-described embodiment can be obtained, the off angle of the sapphire substrate is arbitrary. However, it is preferable to set the off angle at 0.2° or more because the AlN crystals similar to the embodiment described above can be easily obtained.

<Difference Between AlN Crystalline Nuclei in Patent Documents 1 and 2 and Non-Patent Document 1, and Fine AlN Crystals Constituting AlN Layer in the Embodiment of the Present Invention>

Here, a difference will be described between the AlN crystalline nuclei formed before the growth of the AlN layer in Patent Documents 1 and 2 and Non-Patent Document 1, and the fine AlN crystals constituting the AlN layer in the embodiment of the present invention.

First, as described with reference to FIG. 14, in Patent Documents 1 and 2 and Non-Patent Document 1, after the AlN crystalline nuclei are formed on the main surface of the sapphire substrate (first stage of FIG. 14), the AlN layer is formed so as to fill the space between the AlN crystalline nuclei (second stage of FIG. 14). At this time, since the AlN crystalline nuclei are only scattered on the main surface of the sapphire substrate as illustrated in the first stage of FIG. 14, in this stage, the AlN crystalline nuclei have not become "a layer" that sufficiently covers the main surface of the sapphire substrate.

For example, paragraph [0060] of the specification of Patent Document 2 describes that "AlN crystalline nuclei having a diameter of 20 to 50 nm and a height of 20 to 40 nm are formed at a density of about 200/μm². " Here, even though a practically impossible situation is assumed in which the coverage of the AlN crystalline nuclei is maximized, that is, all 200 AlN crystalline nuclei are contained in a region of 1 μm² without lack, and all the AlN crystalline nuclei are circular in a plan view with a diameter of 50 nm, the total area occupied by the AlN crystalline nuclei is less than 0.4 μm², and the coverage is less than 40%. Therefore, in the state where only the AlN crystalline nuclei are formed in Patent Documents 1 and 2 and Non-Patent Document 1, obviously "the layer" has not been formed.

Figure 14:
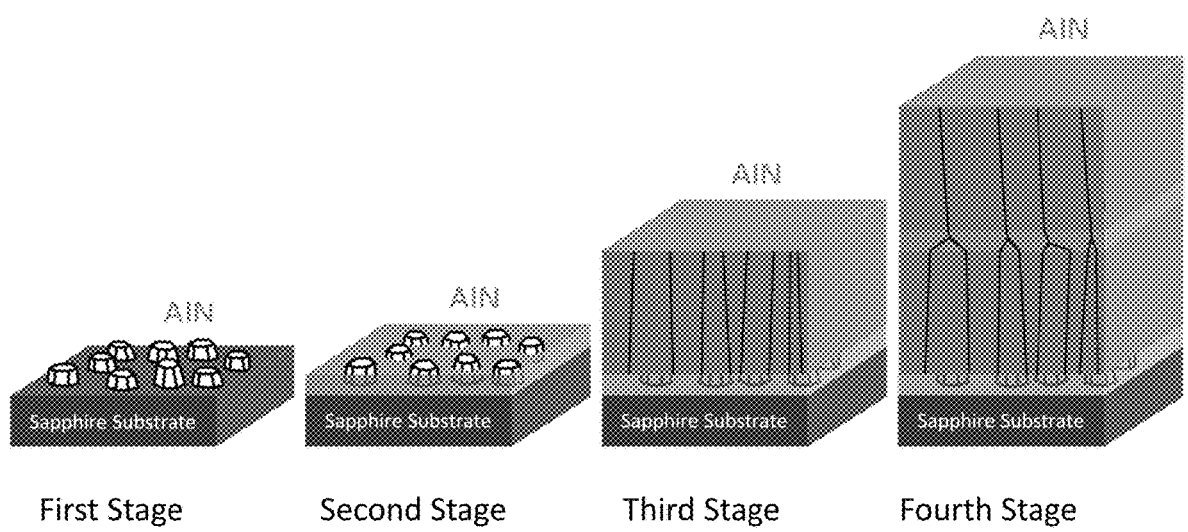
FIG. 14 is a schematic diagram illustrating a conventional method of manufacturing a template.

In Patent Documents 1 and 2 and Non-Patent Document 1, as illustrated in the second stage of FIG. 14, when the film-like AlN crystals filling the space between the AlN crystalline nuclei are formed, "the layer" that sufficiently covers the main surface of the sapphire substrate is formed. Then, when reaching the second stage of FIG. 14, since the film-like AlN crystals having an extremely large average particle diameter and fused with the AlN crystalline nuclei are formed as illustrated in FIG. 12, the average particle diameter of the AlN crystals constituting the AlN layer is as extremely large as about 1000 nm.

Also, paragraph [0071] of the specification of Patent Document 2 describes that "It has been confirmed that the AlN crystalline nuclei 2a have been combined with each other and the AlN layer on the one surface side of the single crystal substrate 1 has been flattened to some extent. Here, the density of the exposed AlN crystalline nuclei 2a has decreased to about 100/μm² and that the diameter of the AlN crystalline nuclei 2a has also increased to about 50 to 100 nm." This means that in the second stage of FIG. 14, the thickness of the film-like AlN crystals has increased and part of the AlN crystalline nuclei are filled with the film-like AlN crystals, and the top of the remaining AlN crystalline nuclei are exposed. Then, in this state, since the film-like AlN crystals having a large average particle diameter and fused with the AlN crystalline nuclei are present as illustrated in FIG. 12, the average particle diameter of the AlN crystals constituting the AlN layer is as extremely large as about 1000 nm.

In contrast, in the template according to the embodiment of the present invention, as is apparent from the AFM images illustrated in FIGS. 3 to 5, "the layer" that sufficiently covers the main surface of the sapphire substrate has already been formed while the fine AlN crystals constituting the AlN layer have been formed. This will be specifically described below with reference to the drawings.

FIG. 15 is a table illustrating a difference of altitude in a measurement region of the AlN layer with a thickness of 300 nm in the template according to the embodiment of the present invention. FIG. 16 is a table illustrating the difference of altitude in the measurement region and a height of a cumulative frequency of 90% where a thickness of the AlN layer is 20 nm in the template according to the embodiment of the present invention. Here, the difference of altitude in the measurement region is a difference between a height of the highest mountain in the measurement region and a height of the lowest valley in the measurement region in the measurement with the above-mentioned AFM device. In addition, the height of the cumulative frequency of 90% is a height when the cumulative total reaches 90% in a case where the height in the measurement region is counted in decreasing order of height. Note that in FIG. 15, the differences of altitude in the measurement region of the AlN layer with a thickness of 300 nm are values obtained from two measurement regions described in the respective tables of FIGS. 10 and 11. In addition, in FIG. 16, the differences of altitude in the measurement region and the heights of the cumulative frequency of 90% of the AlN layer with a thickness of 20 nm are values obtained from two measurement regions out of three measurement regions described in the respective tables of FIGS. 6 to 8.

Figure 17A:
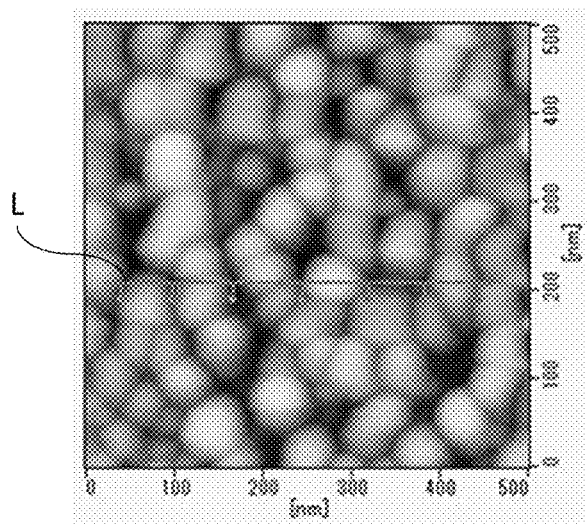
FIGS. 17A to 17C are diagrams illustrating one example of a height profile and a height histogram of the AlN layer with a thickness of 20 nm in the template according to the embodiment of the present invention.
Figure 17B:
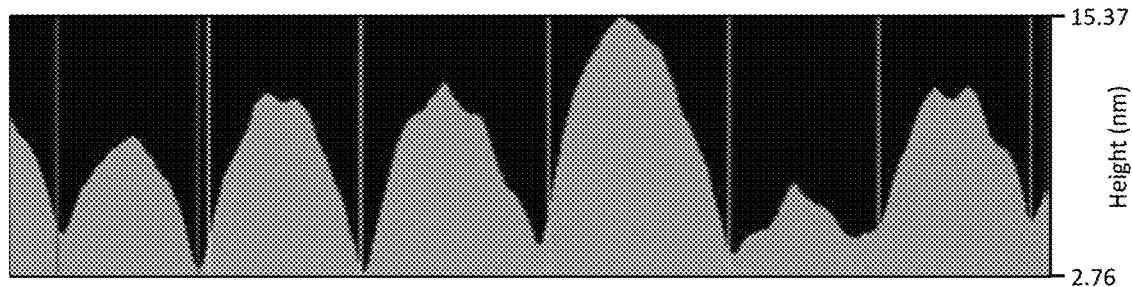
Figure 17C:
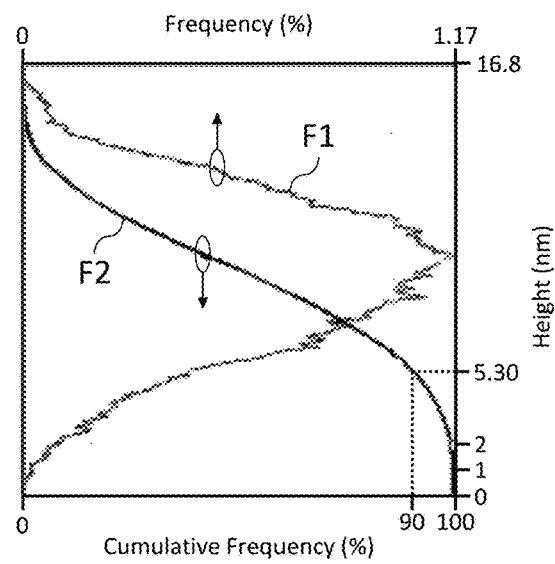

FIGS. 17A to 17C are diagrams illustrating one example of a height profile and a height histogram of the AlN layer with a thickness of 20 nm in the template according to the embodiment of the present invention, and illustrating details of the measurement region of a first row in the table illustrated in FIG. 16. Note that FIG. 17A is an AFM image, FIG. 17B is a height profile along the line L in the AFM image illustrated in FIG. 17A, and FIG. 17C is a height histogram of the measurement region of the AFM image illustrated in FIG. 17A. Note that the measurement region of the AFM image illustrated in FIG. 17A is the same as the measurement region of the AFM image illustrated in FIG. 3. Also, in FIG. 17C, a thin line F1 represents frequency distribution, whereas a dark line F2 represents cumulative frequency distribution.

As illustrated in FIG. 15, the difference of altitude in the measurement region of the AlN layer with a thickness of 300 nm is about 40 nm, which is sufficiently smaller than the thickness of the AlN layer. In this case, it can be said that the AlN crystals with a sufficient thickness are also present in the deepest valley in the measurement region. Therefore, in the 300 nm-thick AlN layer, it can be said that the entire surface of the main surface of the sapphire substrate is covered with the AlN crystals and the coverage of the main surface of the sapphire substrate by the AlN crystals is 100%.

Meanwhile, as illustrated in FIG. 16, the difference of altitude in the measurement region of the AlN layer with a thickness of 20 nm is about 20 nm, which is similar to the thickness of the AlN layer. Therefore, there is a possibility that the AlN crystals are not present in the deepest valley in the measurement region. However, as illustrated in FIG. 16, the height of the cumulative frequency of 90% of the AlN layer with a thickness of 20 nm is about 5 nm. Here, considering that the height of a step on the main surface of the sapphire substrate having an off angle larger than 0 is 0.22 nm and that the average roughness Ra of the main surface is 0.1 nm or less, even if the AlN crystals are not present in the deepest valley in the measurement region, it can be said that there is a high possibility that the AlN crystals are present in a portion having a height of 1 nm or more, and that there is an extremely high possibility that the AlN crystals are present in a portion having a height of 2 nm or more. Therefore, in the template according to the embodiment of the present invention, it can be said that the coverage of the main surface of the sapphire substrate by the AlN crystals at the time when the AlN layer having a thickness of 20 nm is formed is 90% or more, and that "the layer" that sufficiently covers the main surface of the sapphire substrate has been formed.

Actually, in the example illustrated in FIGS. 17A to 17C, the valley bottom is not flat in the height profile of FIG. 17B. Also, in the height histogram illustrated in FIG. 17C, the height of the cumulative frequency of 90% is as high as 5.30 nm, and the cumulative frequency of up to 1 nm (or even 2 nm) in height is a value extremely close to 100%. Also, this tendency applies not only to the measurement region illustrated in FIGS. 17A to 17C (first-row measurement region in the table illustrated in FIG. 16), but also to the other measurement region in the table illustrated in FIG. 16 (measurement region in the second to sixth rows in the table illustrated in FIG. 16). Therefore, in the template according to the embodiment of the present invention, even if the AlN crystals are not present in the deepest valley in the measurement region, it can be said that the AlN crystals sufficiently cover the main surface of the sapphire substrate.

Furthermore, in the template according to the embodiment of the present invention, as described above, the AlN crystals are "the layer" sufficiently covering the main surface of the sapphire substrate, and as is apparent from the AFM images illustrated in FIGS. 3 to 5 and the height profile illustrated in FIG. 17B, adjacent AlN crystals already collide at this point. For this reason, in the template according to the embodiment of the present invention, even if the AlN crystals grow from the state illustrated in FIGS. 3 to 5 (state where the AlN layer is grown by only a thickness of 20 nm), the average particle diameter of the AlN crystals at a thickness of 20 nm from the main surface of the sapphire substrate does not vary much. Therefore, in the template according to the embodiment of the present invention, the average particle diameter of the AlN crystals at a thickness of 20 nm from the main surface of the sapphire substrate is 100 nm or less (furthermore, 75 nm or less).

INDUSTRIAL APPLICABILITY

The present invention can be used for a template including a sapphire substrate and a method of manufacturing the same, and a nitride semiconductor ultraviolet light-emitting element including the template. In particular, the present invention is suitable for use in a template for a nitride semiconductor ultraviolet light-emitting element that has a peak emission wavelength in an ultraviolet region and a method of manufacturing the same, and the nitride semiconductor ultraviolet light-emitting element.

DESCRIPTION OF SYMBOLS 1 nitride semiconductor ultraviolet light-emitting element
10 template
11 sapphire substrate
12 AlN layer
20 element structure part
21 n-type cladding layer
22 active layer
23 electron blocking layer
24 p-type contact layer
25 p-electrode
26 n-electrode

The invention claimed is:
1. A method of manufacturing a template, the method comprising a step of epitaxially growing AlN crystals directly on a main surface of a sapphire substrate with one of a (0001) plane and a plane inclined by a predetermined angle with respect to the (0001) plane as the main surface to form an AlN layer,
  wherein
  the step includes epitaxially growing the AlN crystals under a growth condition that an average particle diameter of the AlN crystals on a surface of the AlN layer epitaxially grown from the main surface to a thickness of 20 nm is 100 nm or less and the AlN layer epitaxially grown to the thickness of 20 nm covers 90% or more of the main surface;
  wherein the step further includes epitaxially growing the AlN layer with using MOVPE method by starting supply of an Al source gas at the same time or earlier than an N source gas to suppress excessive nitriding of the main surface of the sapphire substrate and make the AlN layer +C-axis oriented; and
  wherein the step includes epitaxially growing the AlN layer under a growth condition that an RMS value of surface roughness of the AlN layer epitaxially grown from the main surface to a thickness of 20 nm is equal to or less than an RMS value of surface roughness of an AlN layer epitaxially grown from the main surface to a thickness of 300 nm.
2. The method of manufacturing a template according to claim 1, wherein the step includes epitaxially growing the AlN layer under a growth condition that the average particle diameter of the AlN crystals on the surface of the AlN layer epitaxially grown from the main surface to a thickness of 300 nm is 300 nm or less.

3. The method of manufacturing a template according to claim 1, wherein the step includes epitaxially growing the AlN layer under a growth condition that the RMS value of surface roughness of the AlN layer epitaxially grown from the main surface to a thickness of 20 nm is 5 nm or less.

4. The method of manufacturing a template according to claim 1, wherein the step includes epitaxially growing the AlN layer under a growth condition that an RMS value of surface roughness of the AlN layer epitaxially grown from the main surface to a thickness of 300 nm is 10 nm or less.

5. The method of manufacturing a template according to claim 1, wherein the step includes epitaxially growing the AlN layer under a growth condition that the AlN crystals on the surface of the AlN layer epitaxially grown from the main surface to a thickness of 300 nm are +C-axis oriented.

6. The method of manufacturing a template according to claim 1, wherein the step includes setting a growth temperature of the AlN layer at 1150° C. or higher and 1300° C. or lower.

\* \* \* \* \*